(12) United States Patent
Weisse et al.

(10) Patent No.: US 10,037,896 B2
(45) Date of Patent: Jul. 31, 2018

(54) ELECTRO-ASSISTED TRANSFER AND FABRICATION OF WIRE ARRAYS

(71) Applicant: The Board of Trustees of the Leland Stanford Junior University, Stanford, CA (US)

(72) Inventors: Jeffrey Weisse, Palo Alto, CA (US); Xiaolin Zheng, Palo Alto, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 0 days.

(21) Appl. No.: 14/907,253

(22) PCT Filed: Sep. 26, 2013

(86) PCT No.: PCT/US2013/062022
§ 371 (c)(1),
(2) Date: Jan. 22, 2016

(87) PCT Pub. No.: WO2015/012874
PCT Pub. Date: Jan. 29, 2015

(65) Prior Publication Data
US 2016/0181121 A1 Jun. 23, 2016

Related U.S. Application Data

(60) Provisional application No. 61/858,512, filed on Jul. 25, 2013, provisional application No. 61/864,364, filed on Aug. 9, 2013.

(51) Int. Cl.
*H01L 21/02* (2006.01)
*H01L 21/326* (2006.01)
(Continued)

(52) U.S. Cl.
CPC ........ *H01L 21/326* (2013.01); *B81C 1/00031* (2013.01); *H01L 21/02203* (2013.01);
(Continued)

(58) Field of Classification Search
CPC ......... H01L 21/02603; H01L 21/02606; H01L 21/0259; H01L 21/76259; H01L 29/0676;
(Continued)

(56) References Cited

U.S. PATENT DOCUMENTS 4,534,034 A * 8/1985 Hohla ............... H01S 3/036
372/58
8,044,379 B2 * 10/2011 Wu ................ B82Y 10/00
257/12

(Continued)

FOREIGN PATENT DOCUMENTS

KR  10-2012-0080325       7/2012
KR     20120080325    *  7/2012
WO   WO 2015/190637 A1 * 12/2015

OTHER PUBLICATIONS

International Search Report and Written Opinion (ISA/KR) for International Application No. PCT/US2013/062022, dated Jul. 22, 2014.

(Continued)

*Primary Examiner* — Andrew Q Tran
(74) *Attorney, Agent, or Firm* — Foley & Lardner LLP; Cliff Z. Liu

(57) ABSTRACT

A fabrication method includes: (1) forming a wire array on a fabrication substrate; (2) forming a porous layer within a portion of the fabrication substrate below the wire array; (3) separating the porous layer and the wire array from a remaining portion of the fabrication substrate; and (4) affixing top ends of the wire array to a target substrate.

8 Claims, 10 Drawing Sheets

(51) Int. Cl.
*B81C 1/00* (2006.01)
*H01L 29/06* (2006.01)

(52) U.S. Cl.
CPC .. *H01L 21/02532* (2013.01); *H01L 21/02603* (2013.01); *H01L 29/0676* (2013.01); *B81B 2207/056* (2013.01)

(58) Field of Classification Search
CPC ............... H01L 29/0669; H01L 29/413; H01L 51/0048
See application file for complete search history.

(56) References Cited

U.S. PATENT DOCUMENTS

| | | | |
|---|---|---|---|
| 8,278,191 B2* | 10/2012 | Hildreth | B81C 1/00071 438/460 |
| 2004/0118698 A1 | 6/2004 | Lu et al. | |
| 2006/0163199 A1 | 7/2006 | Van Den Meerakker et al. | |
| 2010/0065819 A1 | 3/2010 | Wu | |
| 2010/0279491 A1 | 11/2010 | Kiuchi et al. | |
| 2013/0270118 A1* | 10/2013 | Park | C25D 11/045 205/50 |

OTHER PUBLICATIONS

Lai, C.O. et al. (2015) "Metal assisted anodic etching of silicon," Nanoscale 7:11123-11134.

Sailor, M.J. (2012) "Chapter 1: Fundamentals of Porous Silicon Preparation," Porous Silicon in Practice: Preparation, Characterization and Applications:1-42.

Sailor, M.J. (2012) "Chapter 4: Freestanding Porous Silicon Films and Particles," Porous Silicon in Practice: Preparation, Characterization and Applications:119-131.

Weisse, J.M. et al. (2013) "Electroassisted Transfer of Vertical Silicon Wire Arrays Using a Sacrificial Porous Silicon Layer," Nano Lett. 13:4362-4368.

Weisse, J.M. et al. (2013) "Transferring Vertically Aligned Silicon Nanowire Arrays to Arbitrary Substrates," Xiaolin Zheng Group, Mechanical Engineering, Stanford University, 2013 Spring Meeting, Apr. 3, 2013 (Presentation).

* cited by examiner

Overall Reaction at Silicon Surface: Si + 6F⁻ + 2H⁺ + 4h⁺ → SiF₆²⁻ +H₂

ELECTRO-ASSISTED TRANSFER AND FABRICATION OF WIRE ARRAYS

This application is a national stage entry under 35 U.S.C. § 371 of International Application No. PCT/US2013/062022, filed on Sept. 26, 2013, which claims the benefit of U.S. Provisional Application No. 61/864,364, filed on Aug. 9, 2013, and the benefit of U.S. Provisional Application No. 61/858,512, filed on Jul. 25, 2013, the disclosures of which are incorporated herein by reference in their entirety.

STATEMENT REGARDING FEDERALLY SPONSORED RESEARCH OR DEVELOPMENT

This invention was made with Government support under contract N00014-10-1-0291 awarded by the Office of Naval Research. The Government has certain rights in this invention.

FIELD OF THE INVENTION

The invention generally relates to the transfer and fabrication of wire arrays and, more particularly, to the transfer and fabrication of such wire arrays using an electro-assisted technique.

BACKGROUND

Silicon (Si) nanowires, due to their potential of surpassing conventional lithography limitations and tuning their chemical and physical properties at the nanometer scale during growth, are attractive building blocks for high-performing functional electronic devices. While extensive research has been devoted to developing methods to assemble and integrate Si nanowires into planar functional devices, limited efforts have been devoted to the device integration of vertical Si wire arrays (both nanowires and microwires) even though such wire arrays are desirable for applications ranging from sensors, solar cells, thermoelectric devices, Li-ion batteries to vertical field-effect transistors.

Si wire arrays with lengths of a few to tens of micrometers are usually formed by the deposition of vapor onto a Si wafer that is about 500 microns thick, rigid, and opaque, or by the chemical etching of such a wafer. Separation of the resulting Si wire arrays from the parent Si wafer allows the electrical, thermal, optical and mechanical properties of the Si wire arrays to be isolated and harnessed in devices without being overshadowed by the properties of the thick parent Si wafer, and allows the transfer of the Si wire arrays to other flexible, lightweight, low cost or transparent substrates for enhanced device functionality. A key condition for the separation and transfer of Si wire arrays is the preservation of their original properties and orientation. A range of techniques have been proposed for the separation of vertical Si wire arrays from their parent Si wafers, which rely on the mechanical breakage of the Si wires by the application of peeling forces, direct shear forces, or the creation of a horizontal porous crack within the Si wires. However, these techniques rely upon encapsulation of the Si wires in a polymer host so that the Si wires are held together during the mechanical breaking process, and the presence of the polymer host makes it difficult to use the separated Si wires for applications that benefit from an exposed Si surface, such as for Ohmic contacts to metal electrodes, sensors or catalysts. In addition, some of these techniques are restricted to Si wires of certain geometries or those made by particular methods.

It is against this background that a need arose to develop the electro-assisted technique described herein.

SUMMARY

Si wire arrays (both nanowires and microwires) are attractive building blocks for high-performing functional electronic devices. Some embodiments of this disclosure are directed to the electro-assisted transfer and fabrication of vertical Si wire arrays. In some embodiments, the technique controls the location of oxidation at a Si surface by directing an electric field during an electro-assisted etching process, yielding two noteworthy capabilities. The first capability is to transfer Si wire arrays from Si wafers on which they are grown to other target substrates while maintaining their original properties and vertical alignment. The second capability is a current-induced metal-assisted chemical etching (MACE) technique that provides facile and rapid synthesis of Si wires with axially modulated porosity. Using the capabilities obtained by controlling an electric field with a Si wafer, large area Si wire arrays can be reproducibility transferred over a large area, and Si wire arrays with desirable properties can be fabricated over a large area while addressing the concerns of depleting a chemical oxidant, continuous unwanted etching along the length of the Si wires, and tuning the oxidation rate during the etch. The electro-assisted technique can be applied to other nanostructures and microstructures grown or fabricated on Si wafers, facilitating their broad applications for electronic devices such as flexible electronic devices.

One aspect of this disclosure relates to a fabrication method, which includes: (1) forming a wire array on a fabrication substrate; (2) forming a porous layer within a portion of the fabrication substrate below the wire array; (3) separating the porous layer and the wire array from a remaining portion of the fabrication substrate; and (4) affixing top ends of the wire array to a target substrate.

In some embodiments, the method further includes removing the porous layer subsequent to affixing the top ends of the wire array to the target substrate. In some embodiments, the wire array is an array of nanostructures. In some embodiments, the wire array is an array of Si nanowires. In some embodiments, the wire array is an array of microstructures. In some embodiments, the wire array is an array of Si microwires. In some embodiments, the fabrication substrate is a Si wafer.

In some embodiments, forming the porous layer is carried out by etching the fabrication substrate while the fabrication substrate is subjected to an applied current. In some embodiments, a width of a space-charge region formed in the fabrication substrate is greater than a radius of a wire in the wire array.

In some embodiments, forming the wire array includes forming a patterned catalyst layer over the fabrication substrate, and applying a current through the fabrication substrate in the presence of an etchant to form the wire array. In some embodiments, the etchant is devoid of a chemical oxidant. In some embodiments, applying the current includes modulating the current over time between a high current density and a low current density.

Another aspect of this disclosure relates to a fabrication method, which includes: (1) providing a substrate; (2) forming a patterned catalyst layer over the substrate; and (3) applying a current through the substrate in the presence of an etchant to form a wire array.

In some embodiments, the substrate is a Si wafer, and the wire array is an array of Si nanowires. In some embodiments, the substrate is a Si wafer, and the wire array is an array of Si microwires.

In some embodiments, the etchant is devoid of a chemical oxidant. In some embodiments, applying the current includes modulating the current over time. In some embodiments, the wire array has an axially modulated porosity. In some embodiments, the wire array has an axially modulated orientation.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

Described herein is an electro-assisted transfer printing technique for the transfer of vertical Si wire arrays from their parent Si wafers to other target substrates, without modification to the properties and orientation of the Si wires, without constraints on the Si wire geometry or fabrication method, and without the need for polymer encapsulation. The fundamental understanding gained from this electro-assisted transfer technique also results in the development of a current-induced MACE technique for the facile and rapid synthesis of Si nanowires with axially modulated porosity.

Figure 1:
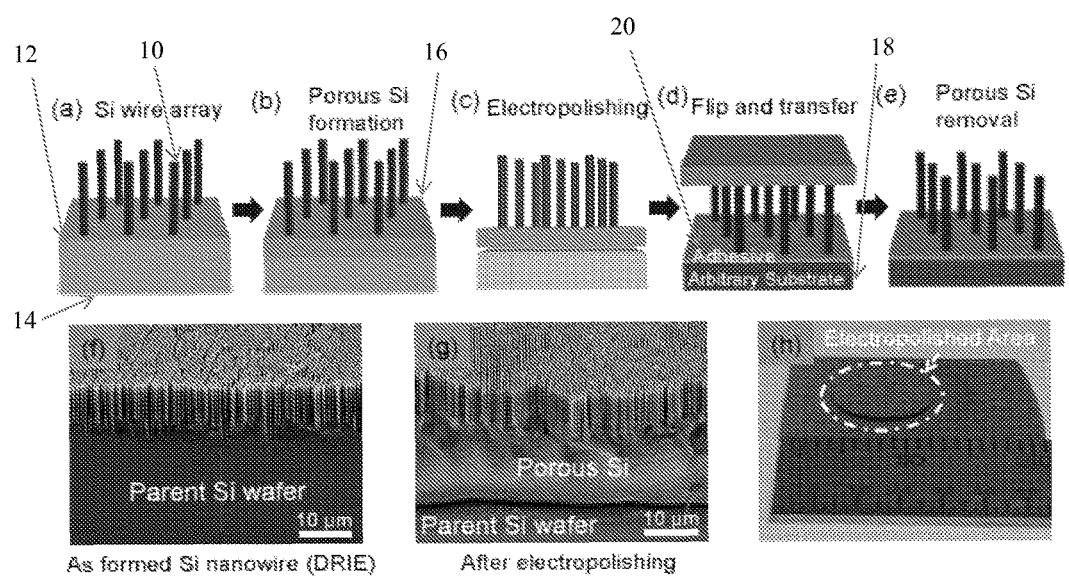
FIG. 1: Schematic of an electro-assisted transfer of vertical Si wire arrays. (a) A vertical Si wire array is fabricated on a parent Si wafer, (b) a sacrificial porous Si layer is formed beneath the Si wire array by electro-etching the parent Si wafer, (c) the porous Si layer, together with the top Si wire array, is detached from the parent Si wafer by electropolishing, (d) the Si wire array supported by the porous Si is flipped over, attached and transferred to any flat substrate coated with an adhesive, and (e) the porous Si layer is etched away. Scanning electron microscopy images of the Si nanowires (formed by deep reactive ion etching) (f) before and (g) after the porous Si layer is electropolished from the Si wafer. (h) An optical image showing that the Si nanowire array held together by the porous Si layer is lifted off from the parent Si wafer after electropolishing.

In some embodiments, the electro-assisted transfer technique involves a sacrificial porous Si layer for the separation of vertical Si wire arrays (both nanowires and microwires) from their parent Si wafers by the general procedure illustrated in FIG. 1. Si wires 10 are first formed by deep reactive ion etching (DRIE) or MACE of a p-type Si wafer 12 with a (100) crystalline orientation (boron dopant concentration of about $10^{14}$ $cm^{-3}$) (FIGS. 1a for schematic and 1f for scanning electron microscopy (SEM) image). Other types of fabrication substrates and other methods for the growth or fabrication of wire arrays are contemplated.

Figure 11:
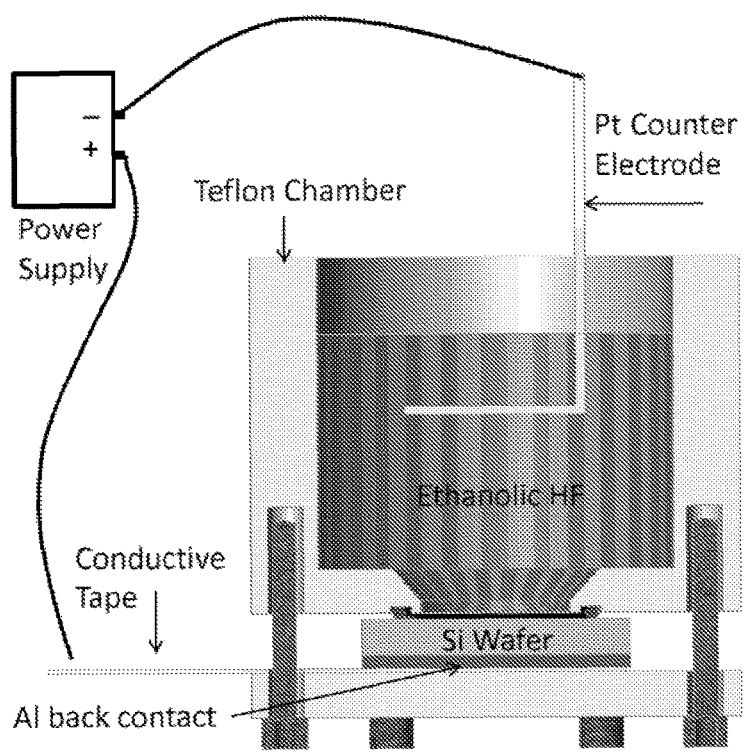
FIG. 11: Cross-sectional schematic of an anodization cell that is used for porous Si formation, electropolishing and current-induced MACE.

Next, a metal layer 14 (here, an aluminum (Al) film) is deposited on the back of the Si wafer 12 to serve as an electrode for the following electro-etching process (see Example). Then the parent Si wafer 12 with the Si wire array 10 on top is placed in a Teflon anodization cell filled with an ethanolic hydrofluoric acid (HF) electrolyte solution (about 1:1 v/v mixture of about 48% HF and about 100% ethanol) (FIG. 11). A substantially constant current of about 50 mA/cm$^2$ is applied for about 20 minutes between the Al electrode 14 on the back of the Si wafer 12 and a platinum (Pt) counter electrode submerged in the ethanolic HF solution, which leads to formation of a porous Si layer 16 of about 15 μm thickness beneath the Si wire array 10 (FIG. 1b). The porous Si layer 16 serves as a temporary handling layer for the Si wire array 10 during transfer to a target substrate 18, and the porosity of the porous Si layer 16 facilitates its preferential removal by etching (instead of the Si wires 10), such as by allowing infiltration of an etchant through pores of the porous Si layer 16. The porosity can be represented as a ratio of a volume of voids relative to a total volume, namely between 0 and 1, or as a percentage between 0 % and 100 %. In some embodiments, the porous Si layer 16 can have a porosity that is at least about 0.05 or at least about 0.1 and up to about 0.95, and, for example, the porosity can be in the range of about 0.1 to about 0.9, about 0.2 to about 0.9, about 0.3 to about 0.9, about 0.4 to about 0.9, about 0.5 to about 0.9, about 0.5 to about 0.8, or about 0.6 to about 0.8. The time duration of the electro-etching process can be varied to yield a desired thickness of the porous Si layer 16, which can be, for example, in the range of about 0.5 μm to about 100 μm or in the range of about 1 μm to about 50 μm.

Figure 2:
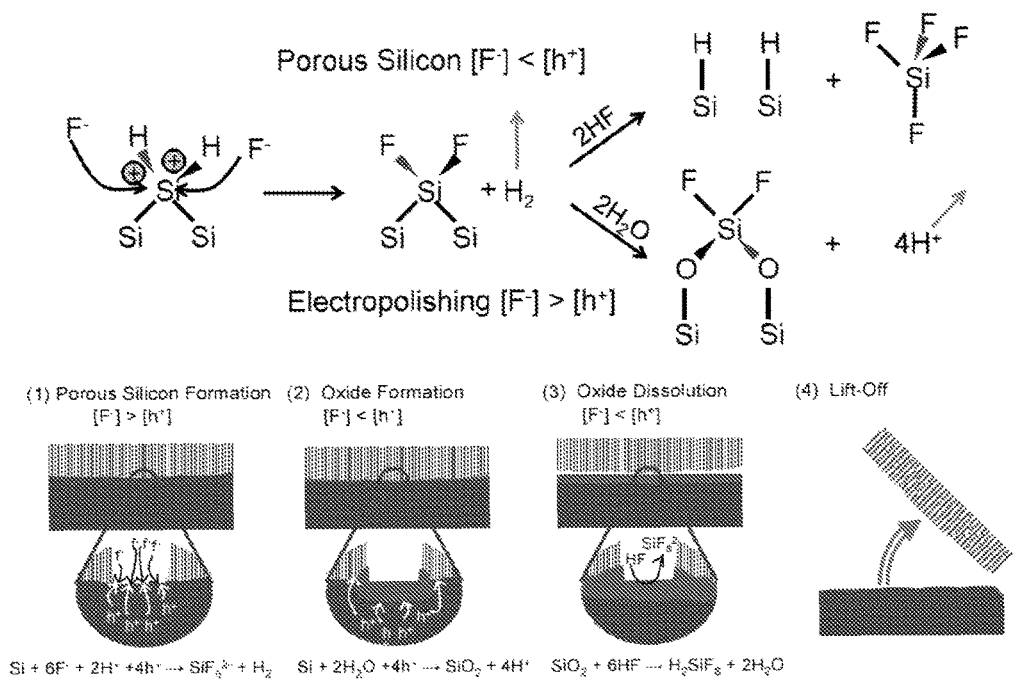
FIG. 2: Schematic of the mechanism of an electro-etching process versus the mechanism of an electropolishing process.

The porous Si layer 16, together with the Si wire array 10 on top, is subsequently separated from the parent Si wafer 12 by electropolishing (FIG. 1c). Electropolishing is achieved by applying about 50 mA/cm$^2$ between the Al and Pt electrodes in an about 1:3 v/v mixture of about 48% HF and about 100% ethanol for about 15 seconds (FIG. 11). The electropolishing process has a lower HF concentration (about 25% vol.) than that of the electro-etching process (about 50% vol.). The smaller concentration of HF in the etchant reduces the diffusional flux of F ions to the Si surface. As such, the Si surface is oxidized to form a substantially continuous oxide layer (instead of individual pores), and the entire oxide layer is subsequently removed as a "lift-off". Without wishing to be bound by a particular theory, FIG. 2 shows the mechanism of the electro-etching process versus the mechanism of the electropolishing process, either of which can be selected by adjusting a balance between the applied current and the concentration of HF in the etchant. FIGS. 1g and 1h are the SEM and optical images of the Si nanowires 10 on top of the porous Si layer 16 after electropolishing, and both images show that the porous Si layer 16, together with the top Si nanowires 10, is separated from the parent Si wafer 12. FIG. 1h shows a case where the porous Si layer 16 (white dotted circle showing the size of the Si area exposed in the anodization cell) is already lifted off from the parent Si wafer 12 by electropolishing. The degree of electropolishing can be tuned from slightly weakened to severely weakened by changing the electropolishing time and applied current.

Next, the entire Si wafer 12 is gently removed from the anodization cell and dried in a critical point drier to mitigate against cracking of the porous Si layer 16. Subsequently, the porous Si layer 16 with the top Si wire array 10 is readily removed from the Si parent wafer 12, inverted and attached to an arbitrary flat, target substrate 18 by an adhesive 20, such as polyvinyl alcohol or silver (Ag) epoxy (FIG. 1d). The porous Si layer 16 is then etched away in an etchant of about 0.03 M potassium hydroxide (KOH) solution containing about 10% ethanol for about 30 minutes, which is capable of removing the porous Si layer 16 with little or no damage to the Si wires 10 due to the low concentration of KOH (FIG. 1e).

Figure 3:
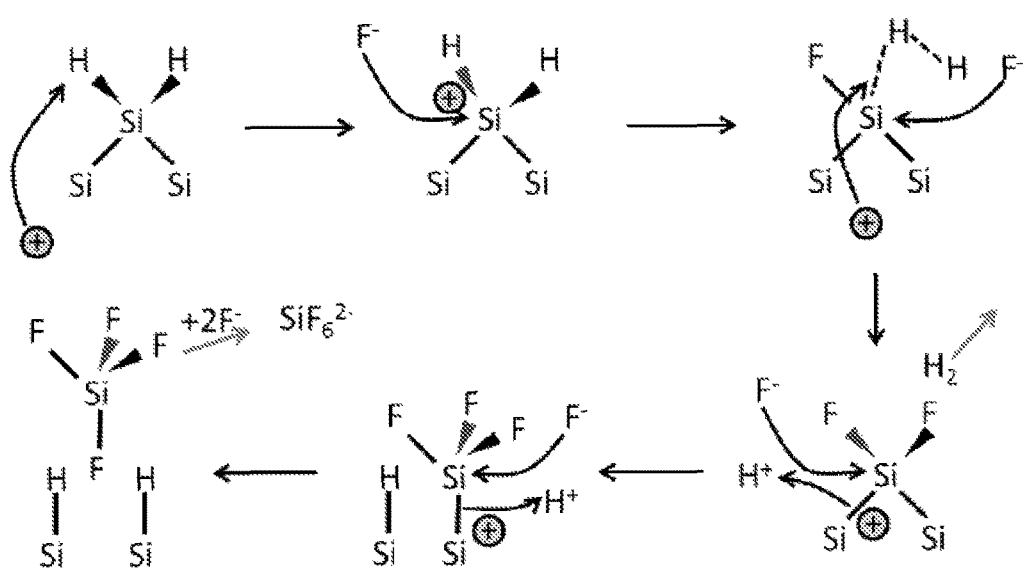
FIG. 3: Schematic of the mechanism of the formation of porous Si when holes reach a Si surface.
Figure 4:
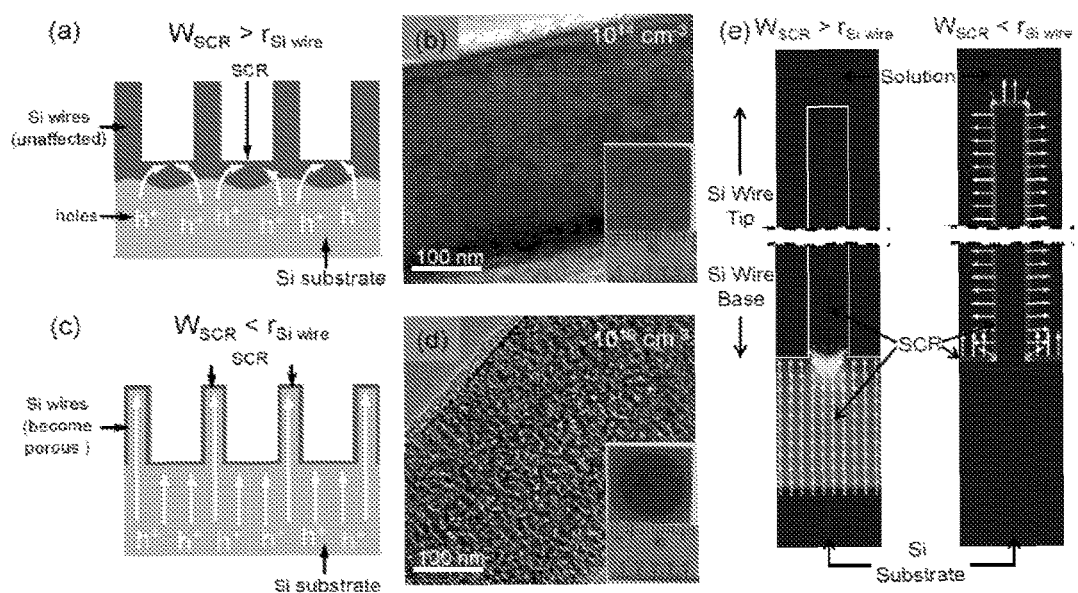
FIG. 4: The location of a space-charge region determines the distribution of an electric field and therefore the location of porous Si formation. Porous Si forms underneath Si wires when the space-charge region (darkened) width $W_{SCR}$ is greater than the Si wire radius $r_{Si\ wire}$ (a, b) and inside the Si wires when $W_{SCR} < r_{Si\ wire}$ (c, d). Transmission electron microscopy and optical images (insets) show that the p-type Si nanowires with doping concentrations of (b) about $10^{14}$ $cm^{-3}$ and (d) about $10^{19}$ $cm^{-3}$ have different internal porosity after the porous Si layer formation, supporting the schematics in (a) and (c), respectively. (e) The calculated electric field around a Si wire shows that the electric field directs holes away from the Si wire when $W_{SCR} > r_{Si\ wire}$ and through the Si wire $W_{SCR} < r_{Si\ wire}$.

One key aspect for the electro-assisted transfer technique is that the formation of porous Si should be substantially confined to the Si underneath the Si wires, not within the Si wires, in order to preserve the original properties of the Si wires. Porous Si is formed when holes (h$^+$) reach a Si surface that is exposed to hydrofluoric acid. Without wishing to be bound by a particular theory, FIG. 3 shows the mechanism of the formation of porous Si when holes reach the Si surface. Therefore, in order to prevent the Si wires from becoming porous, the holes should be directed away from the Si wire surface. This can be accomplished by controlling the width of the space-charge region (SCR) at the Si surface that is in direct contact with the electrolyte. The SCR is depleted of mobile charge carriers, behaving as a nearly insulating region. Since the porous Si is formed under forward bias condition, the current of holes has to pass the SCR region first and then reach the Si surface, with the holes selecting the least resistive pathway. When the width of the SCR ($W_{SCR}$) is larger than the radius of the Si wires ($r_{Si\ wire}$) (FIG. 4a) and the conductivity of the ethanolic HF etchant solution (estimated to be about 1 S/cm) is larger than the conductivity of the depleted Si wires, the least resistive pathway for holes is through the gaps between the Si wires, not through the Si wires, leading to little porosity formation within the Si wires (FIG. 4b). On the other hand, when $W_{SCR}$ is smaller than $r_{Si\ wire}$, the holes can go through the inside of Si wires (FIG. 4c), leading to porosity inside the Si wires and in the Si underneath the wires (FIG. 4d).

To illustrate the importance of the relative width of the SCR to the radius of the Si wires, the electric field around Si wires is simulated using COMSOL Multiphysics™ software (Comsol; Stockholm, Sweden) (see Example). As shown in FIG. 4e, when $W_{SCR}$ is greater than $r_{Si\ wire}$, the electric field directs the holes to flow between the Si wire gap into the solution, not through the Si wires. When $W_{SCR}$ is smaller than $r_{Si\ wire}$, the SCR is localized near the surface of Si wires, and the holes can readily reach the surface of the Si wires. The ratio of $W_{SCR}$ to $r_{Si\ wire}$ can be tuned by changing the doping concentration of the parent Si wafer. The $W_{SCR}$ can be estimated from:

$$W_{SCR} = \left(\frac{2\varepsilon_r \varepsilon_0 V}{eN_A}\right)^{1/2} \qquad (1)$$

where $\varepsilon_r$ is the relative dielectric permittivity, $\varepsilon_0$ is the permittivity of vacuum, V is the applied bias, e is the electron charge and $N_A$ is the number of ionized acceptors. When the Si wires are lightly doped with a boron concentration of about $10^{14}$ cm$^{-3}$, the estimated $W_{SCR}$ is about 3 μm, which is much larger than $r_{Si\ wire}$ (about 140 nm). In this case, the Si wire does not show signs of porosity in the transmission electron microscope (TEM) image in FIG. 4b, taken after porous Si formation. On the other hand, when the Si wires are heavily doped with a boron concentration of about $10^{19}$ cm$^{-3}$, the estimated $W_{SCR}$ is about 10 nm, much smaller than $r_{Si\ wire}$ (about 140 nm). In this case, the Si wire is noticeably porous after porous Si formation (FIG. 4d), and the inset optical image shows that the Si wires are much darker after porous Si formation. Therefore, application of the electro-assisted transfer technique specifies that $W_{SCR}$ should be greater than $r_{Si\ wire}$ to reduce the porosity formation inside the Si wires. The doping concentration of the parent Si wafer can be varied from about $10^{14}$ cm$^{-3}$ while maintaining the condition of $W_{SCR} > r_{Si\ wire}$, such as in the range of about $10^{12}$ cm$^{-3}$ to about $10^{16}$ cm$^{-3}$ or in the range of about $10^{13}$ cm$^{-3}$ to about $10^{15}$ cm$^{-3}$.

Figure 5:
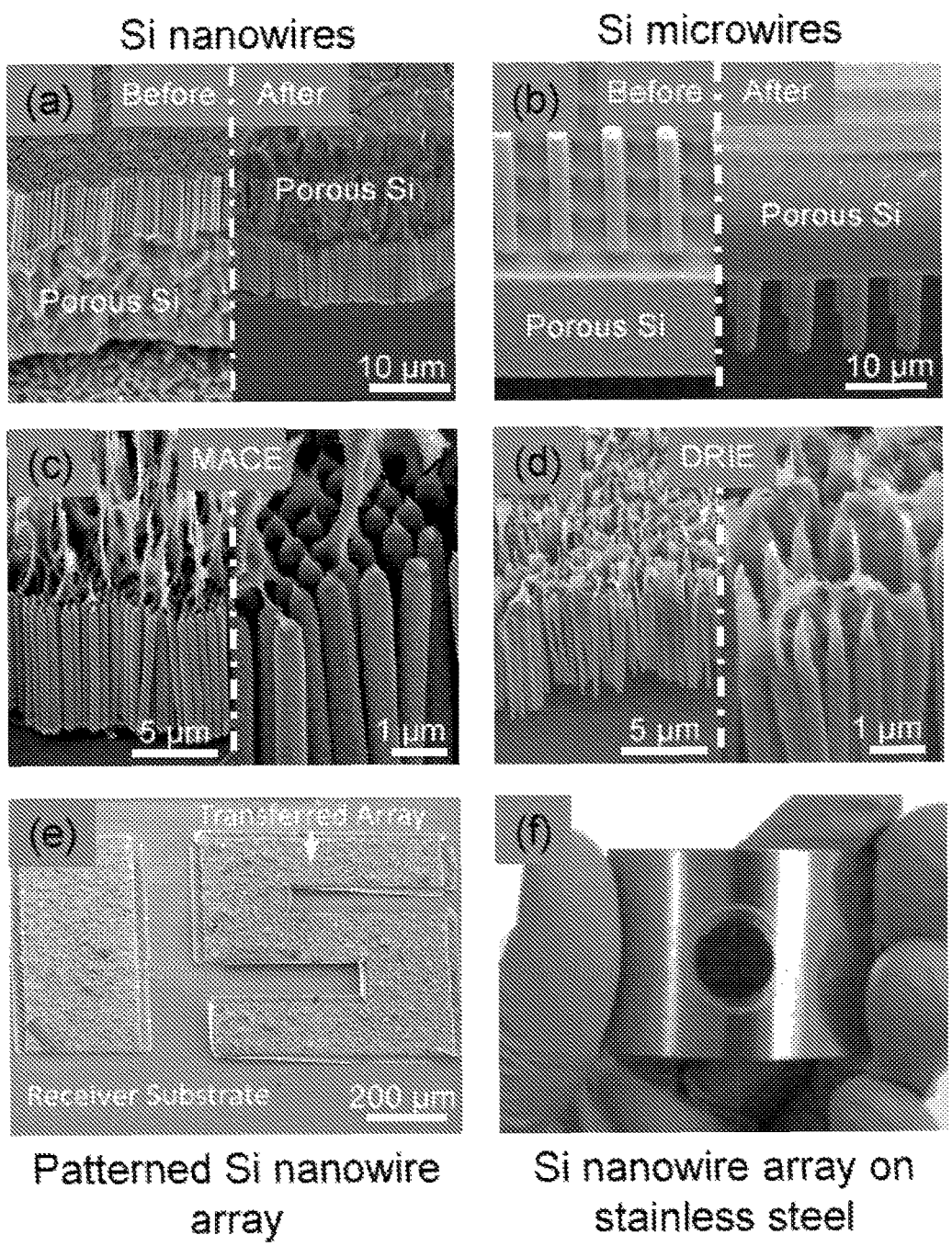
FIG. 5: Generality of the electro-assisted transfer technique in transferring different Si wires to other target substrates. Scanning electron microscopy images of (a) Si nanowires and (b) Si microwires before (left images) and after (right images) the electropolishing and transfer operations. Low (left images) and high magnification (right images) scanning electron microscopy images of transferred (c) MACE and (d) deep reactive ion etching Si nanowire arrays after the sacrificial porous Si layer is etched away. (e) Scanning electron microscopy image shows that a patterned Si nanowire array (in letter 15) is well preserved after being transferred to a different Si substrate and removal of the porous Si layer. (f) Optical image of a Si nanowire array transferred to a flexible stainless steel sheet.

The electro-assisted transfer technique has a number of merits. A first merit is its generality for transferring Si wire arrays, regardless of their dimensions and the methods by which they are fabricated. The transfer of Si nanowires (diameter: about 280 nm, length: about 12 μm, spacing: about 650 nm) formed by the DRIE method is demonstrated in FIG. 1. FIGS. 5a and 5b show that this transfer technique is also applicable to Si nanowire arrays (diameter: about 300 nm, length: about 10 μm, spacing: about 400 nm) fabricated by the MACE method and Si microwires (diameter: about 3 μm, length: about 18 μm, spacing: about 7 μm) formed by the DRIE method. The left SEM images in FIGS. 5a and 5b show the Si wires before the transfer operation but after electropolishing (similar to FIG. 1c). The porous Si layer is visible below the Si wire array and has been separated from the parent Si wafer below. The right SEM images in FIGS. 5a and 5b show the Si wires after they are removed from the parent Si wafer and transferred to a target substrate. The Si wires look substantially identical to those before the transfer. The porous Si layer can be removed after the transfer by etching in an about 0.03 M KOH solution containing about 10% ethanol for about 30 minutes. After the porous Si layer removal, the SEM images in FIGS. 5c and 5d show the remaining Si nanowire arrays formed by MACE and DRIE, respectively. There are still some porous Si strips on the ends of Si nanowires, which is consistent with the simulation results in FIG. 4e in that a narrow strip of Si right underneath the Si wires is not porous due to the local electrical field.

The electro-assisted technique can be applied for transferring arrays of a wide variety nanostructures and microstructures grown or fabricated on Si wafers. Nanostructures and microstructures can be characterized in terms of their material composition, their shape, and their size. Depending on the particular application, nanostructures and microstructures can be formed of a material that is insulating, electrically conductive, or semiconducting, or can be a heterostructure formed of a combination of materials having a combination of characteristics, such as in a core-shell or multi-layered configuration. In some embodiments, nanostructures and microstructures can be formed of a material that is selected based on compatibility with the etchant. For example, nanostructures and microstructures can be formed of a metal, a metal alloy, a metal silicide, a semiconductor, an electrically conductive polymer, or a combination of such materials, and, more particularly, nanostructures and microstructures can be formed of copper, gold, nickel, palladium, platinum, silver, a Group 14 element (e.g., carbon, silicon or germanium), a Group 14-14 binary alloy (e.g., silicon carbide), a Group 13-15 binary alloy (e.g., aluminum nitride), or another binary, ternary, quaternary, or higher order alloy of Group 11 elements, Group 12 elements, Group 13 elements, Group 14 elements, Group 15 elements, Group 16 elements and Group 17 elements.

Nanostructures and microstructures can have any of a variety of shapes, such as pyramid-shaped, cylindrical, tubular, wire-shaped, zigzag-shaped, and a number of other geometric and non-geometric shapes. Examples of nanostructures include high aspect ratio nanostructures, such as nanotubes, nanowires, or a combination of nanotubes and nanowires. Examples of microstructures include high aspect ratio microstructures, such as microtubes, microwires, or a combination of microtubes and microwires.

For example, nanostructures can include nanowires, such as Si or non-Si nanowires, having an average or median diameter in the range of about 1 nm to about 800 nm, about 10 nm to about 800 nm, about 50 nm to about 700 nm, about 100 nm to about 600 nm, about 100 nm to about 500 nm, or about 200 nm to about 400 nm, an average or median length in the range of about 800 nm to about 100 μm, about 1 μm to about 50 μm, about 1 μm to about 40 μm, about 1 μm to about 30 μm, about 1 μm to about 20 μm, or about 1 μm to about 15 μm, and an average or median aspect ratio in the range of about 3 to about 1,000, about 5 to about 900, about 10 to about 800, about 10 to about 700, about 10 to about 600, or about 10 to about 500.

As another example, nanostructures can include nanotubes, such as carbon nanotubes, having an average or median diameter (e.g., outer diameter) in the range of about 1 nm to about 800 nm, about 10 nm to about 800 nm, about 50 nm to about 700 nm, about 100 nm to about 600 nm, about 100 nm to about 500 nm, or about 200 nm to about 400 nm, an average or median length in the range of about 800 nm to about 100 μm, about 1 μm to about 50 μm, about 1 μm to about 40 μm, about 1 μm to about 30 μm, about 1 μm to about 20 μm, or about 1 μm to about 15 μm, and an average or median aspect ratio in the range of about 3 to about 1,000, about 5 to about 900, about 10 to about 800, about 10 to about 700, about 10 to about 600, or about 10 to about 500.

As another example, microstructures can include microwires, such as Si or non-Si microwires, having an average or median diameter in the range of about 1 μm to about 200 μm, about 1 μm to about 150 μm, about 1 μm to about 100 μm, about 1 μm to about 50 μm, about 1 μm to about 20 μm, or about 1 μm to about 10 μm, an average or median length in the range of about 800 nm to about 100 μm, about 1 μm to about 50 μm, about 1 μm to about 40 μm, about 1 μm to about 30 μm, about 1 μm to about 20 μm, or about 1 μm to about 15 μm, and an average or median aspect ratio in the range of about 3 to about 1,000, about 5 to about 900, about 10 to about 800, about 10 to about 700, about 10 to about 600, or about 10 to about 500.

As a further example, microstructures can include microtubes, such as carbon microtubes, having an average or median diameter (e.g., outer diameter) in the range of about 1 μm to about 200 μm, about 1 μm to about 150 μm, about 1 μm to about 100 μm, about 1 μm to about 50 μm, about 1 μm to about 20 μm, or about 1 μm to about 10 μm, an average or median length in the range of about 800 nm to about 100 μm, about 1 μm to about 50 μm, about 1 μm to about 40 μm, about 1 μm to about 30 μm, about 1 μm to about 20 μm, or about 1 μm to about 15 μm, and an average or median aspect ratio in the range of about 3 to about 1,000, about 5 to about 900, about 10 to about 800, about 10 to about 700, about 10 to about 600, or about 10 to about 500.

A second merit of the transfer technique is that the alignment and structure of the Si wires (or other nanostructures or microstructures) are kept intact by the porous Si layer during the transfer. As such, even-patterned Si wire arrays can be transferred with high fidelity. FIG. 5e shows that a pre-patterned Si nanowire array (number: 15) is transferred to a different Si substrate while maintaining the patterned shape.

A third merit of the electro-assisted transfer technique is that Si wires (or other nanostructures or microstructures) can be transferred to virtually any target substrate, such as stainless steel sheets (FIG. 5f), as long as the target substrate is kept flat during the attachment of the Si wire array. As such, the transfer technique allows the growth or fabrication of nanostructure arrays on conventional substrates, and the subsequent transfer of the nanostructure arrays to non-conventional substrates, such as paper, plastics, tapes, textiles, glasses, polymer substrates, and metal foils or sheets.

Figure 6:
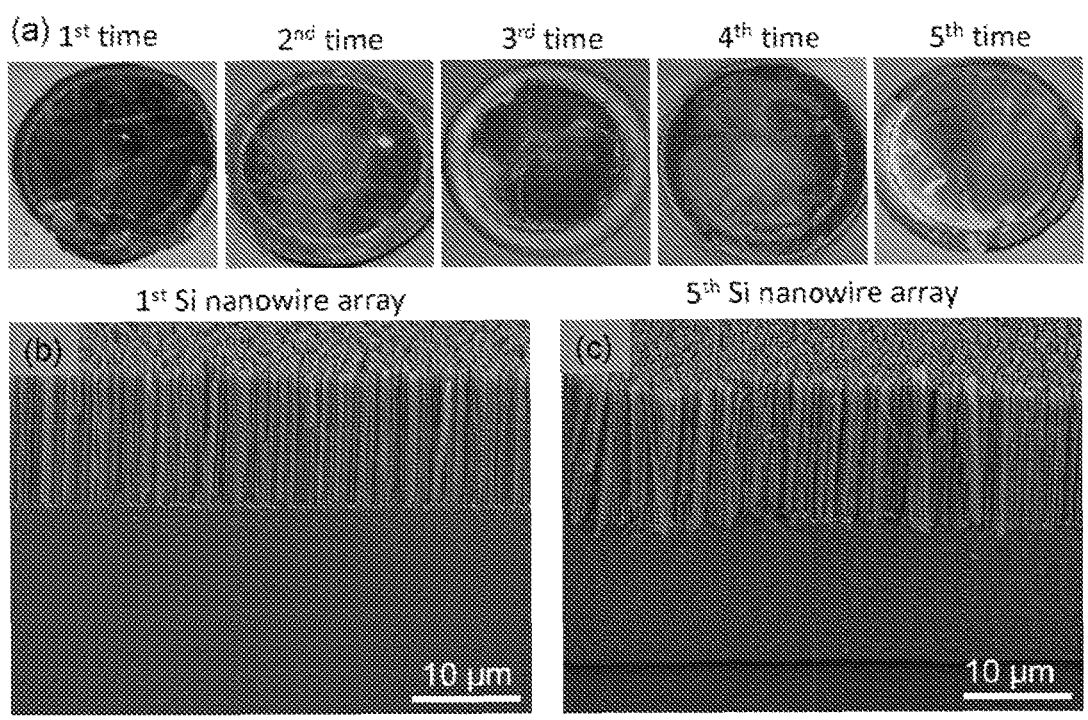
FIG. 6: Recyclability of a parent Si wafer to form and transfer Si wire arrays for multiple times. (a) Optical images of five Si nanowire arrays that are consecutively formed by MACE and transferred. Scanning electron microscopy images show that Si nanowires of similar morphology are formed by the electro-assisted transfer method before the (b) first and (c) fifth time transfer.

A fourth merit is that Si wafers (or other fabrication substrates) can be repeatedly used to form vertical Si wire arrays by etching and transferring Si wires to different target substrates. Since the electropolishing operation creates a new and relatively flat polished Si surface underneath the porous Si layer, it allows new Si wires to be etched on the same parent Si wafer. The recycling ability of the Si wafer is demonstrated in FIG. 6 by forming Si nanowire arrays by MACE and transferring them five consecutive times. As shown in FIG. 6a, new Si nanowire arrays can be formed after each transfer, though the uniformity decreases since the freshly exposed Si surface is not perfectly flat after electropolishing. The surface roughness of the Si can be improved by adding an intermediate surface polishing operation. Even though there is some global surface roughness, the morphology of the first array of Si nanowires (FIG. 6b) is similar to that of the fifth wire array (FIG. 6c), showing the ability to recycle the parent Si wafer.

Figure 7:
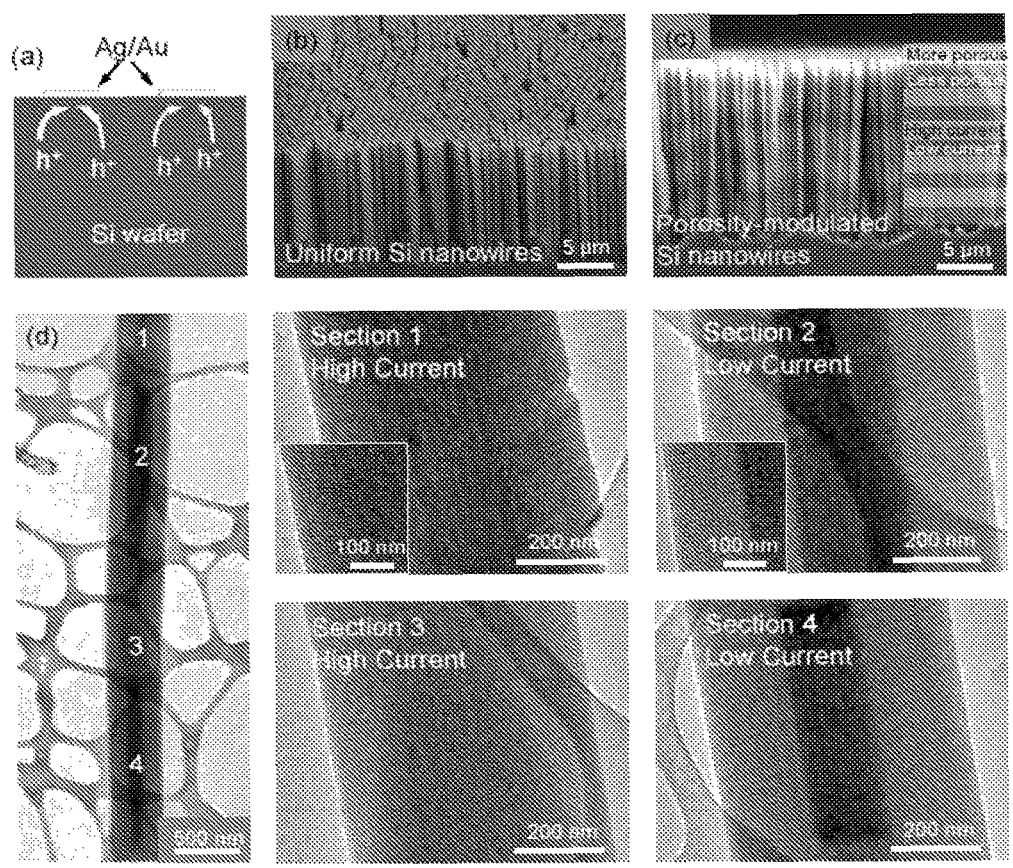
FIG. 7: Synthesis of Si nanowires by the current-induced MACE for which the oxidizer, $H_2O_2$, is replaced by an applied current. (a) Schematic shows that the holes within the Si substrate preferentially oxidize Si beneath the patterned Ag/Au catalyst. (b) Scanning electron microscopy image of an axial uniform Si nanowire array etched in an about 4.8 M HF solution with a substantially constant applied current of about 15 $mA/cm^2$. (c) Scanning electron microscopy and (d) transmission electron microscopy images of a Si nanowire array with axially modulated porosity etched in an about 4.8 M HF solution by switching the applied current between about 7 and about 23 $mA/cm^2$ periodically in an about 4.8 M HF solution. High magnification transmission electron microscopy images show that the high current density (about 23 $mA/cm^2$) results in porous Si nanowire segments (center images, sections 1 and 3), and the low current density (about 7 $mA/cm^2$) results in non-porous/porous core/shell Si nanowire segments (right images, sections 2 and 4).
Figure 8:
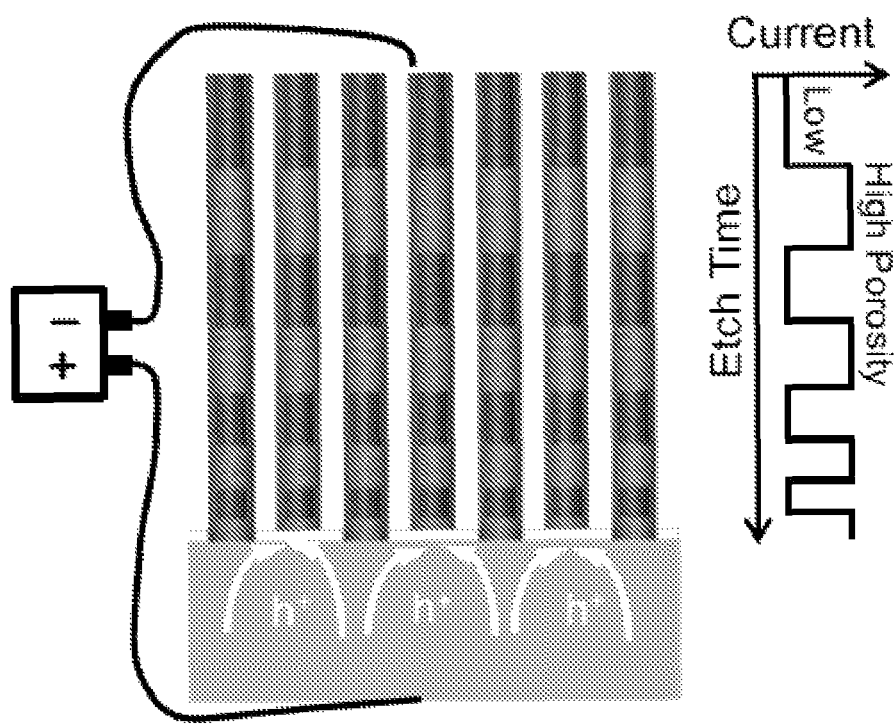
FIG. 8: Schematic of a Si nanowire array with axially modulated porosity that can be fabricated by current-induced MACE.
Figure 9:
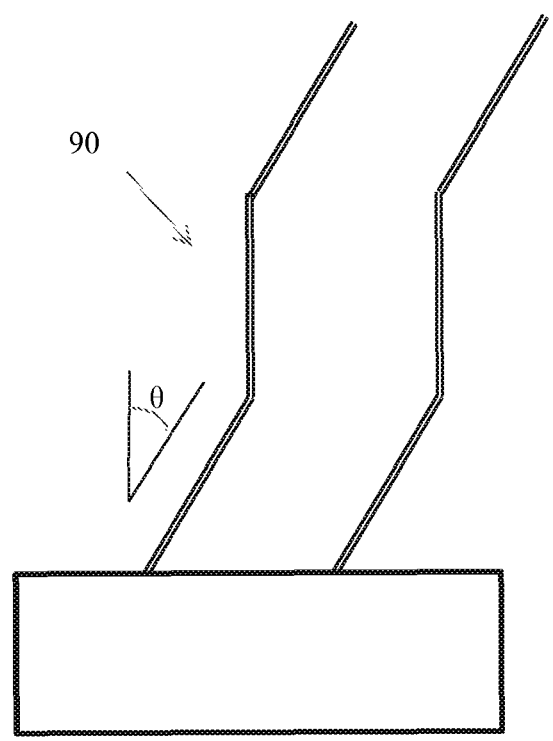
FIG. 9: Schematic of a zigzag-shaped Si nanowire array with axially modulated orientation that can be fabricated by current-induced MACE.

In the electro-assisted transfer technique, the holes are the oxidizing species, and are supplied from inside the parent Si wafer. The local concentration of holes controls the local oxidation rate of the Si and its removal rate by HF. Holes can play a similar oxidizer role as the $H_2O_2$ typically used in MACE, and, in some embodiments, $H_2O_2$ is replaced in MACE with an electrical current (corresponding to a flow of holes) to synthesize Si nanowires (or other nanostructures or microstructures). To illustrate this, the preparation operations of the MACE technique are carried out by first patterning the Ag/Au catalyst on top of a Si wafer. Next, the Ag/Au coated Si wafer is placed in a Teflon anodization cell filled with a modified MACE etchant (about 4.8 M HF solution but without $H_2O_2$). Then, a current is passed between the Al contact on the back of the Si wafer and a Pt counter electrode immersed in the etchant to supply holes that mimic the role of $H_2O_2$. The holes move towards the top Ag/Au film (FIG. 7a), where the Si underneath the Ag/Au is subsequently oxidized and removed by HF, leading to the formation of Si nanowire arrays (FIG. 7b, etching conditions: about 15 mA/cm$^2$ for about 20 minutes). The benefits of using current, instead of $H_2O_2$, for MACE are most pronounced when synthesizing Si nanowires with 1) long lengths for which the poor transport of $H_2O_2$ onto Si nanowire surface can lead to etching non-uniformity or 2) axially modulated porosity or zigzag shapes. With conventional MACE, the Si wafer has to be switched between etchants of different concentrations of $H_2O_2$ to vary the porosity or control the etching direction. In the current-induced MACE, the Si wafer can stay in the same etchant but the applied current is varied over time to control the etching porosity or direction. For example, when the applied current is modulated between a high current density and a low current density, such as between about 7 mA/cm$^2$ and about 23 mA/cm$^2$ periodically, the oxidation rates of Si are changed correspondingly, leading to the formation of Si nanowire arrays with axially (or lengthwise) modulated porosity as highlighted by the TEM images in FIGS. 7c and 7d. Specifically, the high current density (about 23 mA/cm$^2$) results in porous Si nanowire segments (FIG. 7d, sections 1 and 3) and the low current density (about 7 mA/cm$^2$) results in non-porous/porous core/shell Si nanowire segments (FIG. 7d, sections 2 and 4). It is also contemplated that application of a low current density can result in substantially uniform non-porous segments (instead of segments having a core/shell configuration). FIG. 8 is a schematic of a Si nanowire array 80 with axially modulated porosity that can be fabricated by current-induced MACE. As another example, when the applied current is modulated between a high current density and a low current density and a Si wafer with a crystalline orientation different from (100) is used, such as (111), the etching direction is changed correspondingly, leading to the formation of Si nanowire arrays with zigzag shapes. FIG. 9 is a schematic of a zigzag-shaped Si nanowire array 90 with axially modulated orientation that can be fabricated by current-induced MACE. As shown in FIG. 9, the modulation of an applied current results in Si nanowire segments with one orientation $\theta_1$ and Si nanowire segments with a different orientation $\theta_2$. For example, $\theta_1$ can be in the range of about 20° to about 70° or about 30° to about 60°, and $\theta_2$ can be in the range of about 0° to about 20° or about 0° to about 10°.

Figure 10:
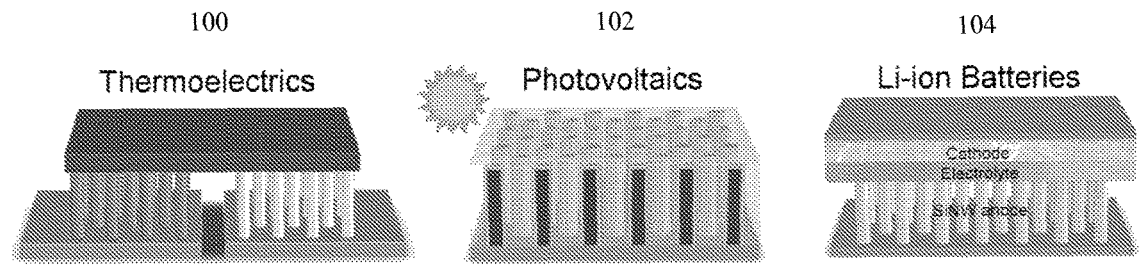
FIG. 10: Schematics of example devices that can be fabricated using the electro-assisted transfer technique.

The electro-assisted technique can be applied to device integration of arrays of nanostructures and microstructures for applications ranging from sensors, solar cells, thermoelectric devices, Li-ion batteries to vertical field-effect transistors. FIG. 10 shows schematics of example devices that can be fabricated, including a thermoelectric device 100, a photovoltaic device 102, and a Li-ion battery 104.

By way of summary, embodiments of this disclosure provide a general electro-assisted transfer technique for transferring Si wire arrays (or other nanostructure or microstructure arrays), regardless of their dimensions and fabrication methods, to virtually any other flat substrates while maintaining their original properties and vertical alignment. This transfer technique can be based on the formation of a sacrificial porous Si layer underneath the Si wire array. The porous Si layer, together with the Si wire array on top, is subsequently separated from the parent Si wafer by electropolishing, and the Si wire array is then transferred to other target substrates. The formation of porosity in the Si wires can be prevented by controlling the electric field around the Si wire arrays through the formation of a space-charge region with greater width than the radius of the Si wire. It is contemplated that this transfer technique can be applied to transfer other nanostructures or microstructures fabricated or grown on Si wafers as well. Finally, the concept of controlling the oxidation location of Si is expanded to develop a current-induced MACE technique. The current-induced MACE technique replaces $H_2O_2$ with an applied current and allows facile and rapid control of the Si oxidation rate by variation of the current, allowing the formation of Si nanowires with axially modulated porosity. It is contemplated that the current-induced MACE technique can be applied for fabricating arrays of a wide variety of nanostructures and microstructures on Si wafers or other fabrication substrates.

Embodiments of the electro-assisted technique described herein provide a number of advantages, including one or more of the following:

1) Reduces substrate effects from device performance.
2) Cost-effective by allowing wafer reuse.
3) Scalability by allowing wafer-scale transfer and removing the need to rely on mechanical forces or dilutions of solutions.
4) Preserves length, uniformity and alignment of arrays of nanostructures or microstructures.
5) Nearly 100% transfer yield.
6) Provides superior control over the oxidation rate during wire array formation.
7) Using an electric field to form arrays of nanostructures or microstructures using the current-induce MACE technique provides a way to supply a substantially constant and continuous oxidation rate over a long period of time without diluting an etchant solution, and allows the ability to rapidly tune the oxidation rate during the formation process.

EXAMPLE

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Experimental Methods:

Preparation of DRIE Si nanowires. The DRIE Si nanowires are patterned by nanosphere lithography. Then, the silica spheres (about 650 nm) are reduced to about 550 nm by reactive ions in a mixture of $O_2$ and $CHF_3$ to form a non-closed-packed monolayer. Next, the Si nanowires are etched using DRIE (cycles of about 6 second etching with about 130 sccm of $SF_6$ and about 5 second passivation with about 120 sccm of $C_4F_8$ in about 600 W plasma power) with the silica spheres acting as a masking layer until the desired length is achieved. The silica spheres are partly etched during the DRIE process, resulting in Si nanowire diameters around 280 nm. All the polymer by-products from the DRIE process and the silica spheres are subsequently removed in a 3:1 (v:v) mixture of sulfuric acid ($H_2SO_4$) and hydrogen peroxide ($H_2O_2$) for about 10 minutes, followed by about 10 minute soak in about 2% HF. An about 200 nm Al contact is deposited on the backside of the Si wafer and annealed at about 400° C. for about 30 minutes, creating an ohmic contact to the Si wafer.

Preparation of metal-assisted MACE Si nanowires using nanosphere lithography. MACE Si nanowires with controlled diameter and density are fabricated using nanosphere lithography and e-beam evaporated noble metals. First, an about 200 nm Al backside contact is deposited and annealed on the Si wafer. Then, a monolayer of about 400 nm silica spheres are deposited and reduced to about 300 nm on the Si front surface (same general nanosphere lithography operation as above). An about 15 nm Ag film followed by an about 5 nm gold (Au) film is evaporated over the silica spheres, followed by the spheres removal via sonication. The Si wafer surface oxide between the patterned metal film is first etched by an about 2% HF solution for about 2 minutes. The Si nanowires are subsequently formed by etching the Si wafer in a solution containing about 4.8 M HF and about 0.3 M $H_2O_2$ with the assistance of a stir bar until the desired length is achieved. Finally, the metal catalyst is removed by soaking in an about 3:1 (v:v) mixture of hydrochloric acid (HCl) and nitric acid ($HNO_3$) for about 10 minutes.

Preparation of MACE Si nanowires using silver salts. MACE Si nanowires with smaller but somewhat less controlled diameters to demonstrate the recycling capability are fabricated using silver salts. First, the Al contact is deposited on the back of the Si wafer. Next, the exposed front side of the Si wafer is cleaned by soaking in about 3:1 (v/v) $H_2SO_4$:$H_2O_2$ for about 10 minutes followed by about 2% HF for about 2 minutes. Then, a thin silver film is electrodeposited on the exposed Si wafer surface in a solution of about 4.8 M HF and about 0.005 M $AgNO_3$ for about 45-75 seconds with the assistance of a stir bar. The residual $AgNO_3$ is removed with thorough rinsing in deionized (DI) water. The Si nanowires are then etched using the above MACE solution until the desired length is achieved.

Anodization cell. FIG. 11 illustrates the anodization cell that is used for porous Si formation, electropolishing and current-induced MACE.

Modeling of the electric field strength around the Si wire. The finite element program, COMSOL Multiphysics 4.3a (COMSOL; Stockholm, Sweden) with the electric current physics package, is used to simulate the electric field around the Si wires. The computational domain contains a Si wire (diameter: 300 nm, length: 10 μm) that is attached to a Si wafer and in contact with an ethanol based solution. Periodic boundary conditions are used on the left and right sides of the computation domain to simulate periodic Si wire arrays. The SCR is modeled as an intrinsic silicon layer with a resistivity of $2.3 \cdot 10^4$ Ω-cm, and the layer width is estimated by Equation (1). A constant current density of 50 mA/cm$^2$ is applied to the base of the Si wafer, and the solution about 50 μm above the Si wire tip is set as a ground. The steady state electric field is simulated to determine the relative electric field strengths around the Si wire.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, operation or operations, to the objective, spirit and scope of the invention. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations is not a limitation of the invention.

What is claimed is:

1. A fabrication method, comprising:
providing a substrate including a first side and an opposite, second side;
forming a patterned catalyst layer over the second side of the substrate;
providing (a) a first electrode adjacent to the first side of the substrate and (b) a second electrode adjacent to the patterned catalyst layer; and
applying a current between the first electrode and the second electrode and through the substrate in the presence of an etchant to form a wire array, wherein the current supplies charge carriers as oxidizing species that move toward the patterned catalyst layer, such that a material of the substrate adjacent to the patterned catalyst layer is oxidized and removed in the presence of the etchant.

2. The fabrication method of claim 1, wherein the substrate is a Si wafer, and the wire array is an array of Si nanowires.

3. The fabrication method of claim 1, wherein the substrate is a Si wafer, and the wire array is an array of Si microwires.

4. The fabrication method of claim 1, wherein the etchant is devoid of a chemical oxidant.

5. The fabrication method of claim 1, wherein applying the current includes modulating the current over time between a high current density and a low current density while forming the wire array.

6. The fabrication method of claim 5, wherein the wire array has an axially modulated porosity.

7. The fabrication method of claim 5, wherein the wire array has an axially modulated orientation.

8. The fabrication method of claim 1, wherein forming the patterned catalyst layer over the second side of the substrate includes:
- depositing discrete, masking structures over the second side of the substrate;
- depositing a catalyst layer over and in between the discrete, masking structures; and
- removing the discrete, masking structures to form the patterned catalyst layer.

* * * * *